(12) United States Patent
Hong et al.

(10) Patent No.: US 6,395,601 B2
(45) Date of Patent: May 28, 2002

(54) METHOD FOR FORMING A LOWER ELECTRODE FOR USE IN A SEMICONDUCTOR DEVICE

(75) Inventors: Kwon Hong; Yong-Sik Yu, both of Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/740,872

(22) Filed: Dec. 21, 2000

(30) Foreign Application Priority Data

Dec. 29, 1999 (KR) .............................. 99-65169

(51) Int. Cl.[7] .......................................... H01L 21/8242
(52) U.S. Cl. ........................ 438/253; 438/254; 438/396; 438/240
(58) Field of Search ...................... 438/240, 253–256, 438/396–399

(56) References Cited

U.S. PATENT DOCUMENTS

| | | | | |
|---|---|---|---|---|
| 5,566,045 A | * | 10/1996 | Summerfelt et al. | 29/25.42 |
| 5,585,300 A | * | 12/1996 | Summerfelt | 438/2 |
| 6,171,899 B1 | * | 1/2001 | Liou et al. | 438/240 |
| 6,211,035 B1 | * | 4/2001 | Moise et al. | 438/396 |
| 6,255,187 B1 | * | 7/2001 | Horii | 438/396 |
| 6,281,142 B1 | * | 8/2001 | Basceri et al. | 438/771 |
| 6,294,425 B1 | * | 9/2001 | Hideki | 257/306 |

\* cited by examiner

*Primary Examiner*—John F. Niebling
*Assistant Examiner*—Jennifer M. Kennedy
(74) *Attorney, Agent, or Firm*—Finnegan, Henderson, Farabow, Garrett & Dunner, L.L.P.

(57) ABSTRACT

A method for manufacturing a semiconductor device can form a thick lower electrode made of Pt. The method begins with the preparation of an active matrix provided with at least one diffusion region and an insulating layer formed thereon. Thereafter, the insulating layer is patterned into a predetermined configuration, thereby exposing the diffusion region and a metal silicide film is formed on the exposed diffusion region. And then, a barrier metal is formed on the metal silicide and a seed layer is formed on the active matrix including the barrier metal. In an ensuing step, a dummy oxide layer is formed on the seed layer and a dummy oxide layer is patterned into a preset configuration, thereby exposing portions of the seed layer which are located above the barrier metal. Next, the exposed portions of the seed layer are filled with a conductive material to a predetermined thickness. In a following step, the dummy oxide layer and the seed layer which are not covered with the conductive material is removed by using an etch technique to obtain a lower electrode structure.

17 Claims, 5 Drawing Sheets

METHOD FOR FORMING A LOWER ELECTRODE FOR USE IN A SEMICONDUCTOR DEVICE

FIELD OF THE INVENTION

The present invention relates to a semiconductor device; and, more particularly, to a method for forming a lower electrode for use in a semiconductor device by using an electroplating method.

DESCRIPTION OF THE PRIOR ART

As is well known, a dynamic random access memory (DRAM) with at least one memory cell comprised of a transistor and a capacitor has a higher degree of integration mainly by down-sizing through micronization. However, there is still a demand for downsizing the area of the memory cell.

To meet the demand, there have been proposed several structures for the capacitor, such as a trench type or a stack type capacitor, which are arranged three-dimensionally in a memory device to reduce the cell area available to the capacitor. However, the process of manufacturing three-dimensionally arranged capacitor is a long and tedious one and consequently involves high manufacturing cost. Therefore, there is a strong demand for a new memory device that can reduce the cell area with securing a requisite volume of information without requiring complex manufacturing steps.

Since capacitance is a function of dielectric area and the dielectric constant of the dielectric material, there have been introduced a high K dielectric, e.g., barium strontium titanate (BST) or the like, as a capacitor thin film in place of conventional silicon oxide film or silicon nitride film to increase capacitance in a given area. However, the use of high dielectric constant materials presents a problem when using a conventional material like ruthenium (Ru) as an electrode. The Ru electrode creates leakage current in the capacitance device.

Therefore, platinum (Pt) is suitable for use as electrodes in this situation. However, if a novel metal such as Pt is applied to a capacitor as a lower electrode, there easily occurs a misalign problem between a contact plug and a storage node. On the other hand, if a barrier layer is adopted to prevent this problem, it is directly in contact with a high K capacitor dielectric, which will, in turn, serves as a source of a leakage current.

Thus, there remains a need for a method of forming an electrode compatible with a high K capacitor dielectric without representing the above-described problems.

SUMMARY OF THE INVENTION

It is, therefore, an object of the present invention to provide a semiconductor device incorporating therein lower electrodes which are formed by using an electroplating method.

In accordance with one aspect of the present invention, there is provided a method for manufacturing a semiconductor device for use in a memory cell, the method comprising the steps of: a) preparing an active matrix provided with at least one diffusion region and an insulating layer formed thereon; b) patterning the insulating layer into a predetermined configuration, thereby exposing the diffusion region; c) forming a metal silicide film on the exposed diffusion region; d) forming a barrier metal on the metal silicide film; e) forming a seed layer on the active matrix including the barrier metal; f) forming a dummy oxide layer on the seed layer; g) patterning a dummy oxide layer into a preset configuration, thereby exposing portions of the seed layer which are located above the barrier metal; h) filling the exposed portions of the seed layer with a conductive material to a predetermined thickness; and i) removing the dummy oxide layer and the seed layer which are not covered with the conductive material.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

There are provided in FIGS. 1A to 1J cross sectional views setting forth a method for manufacturing a semiconductor device incorporating therein a lower electrode which is formed by using an electroplating method in accordance with preferred embodiments of the present invention.

FIGS. 1A to 1J are schematic cross sectional views setting forth the method for manufacture of a capacitor structure for use in a semiconductor memory device in accordance with the present invention.

Figure 1A:
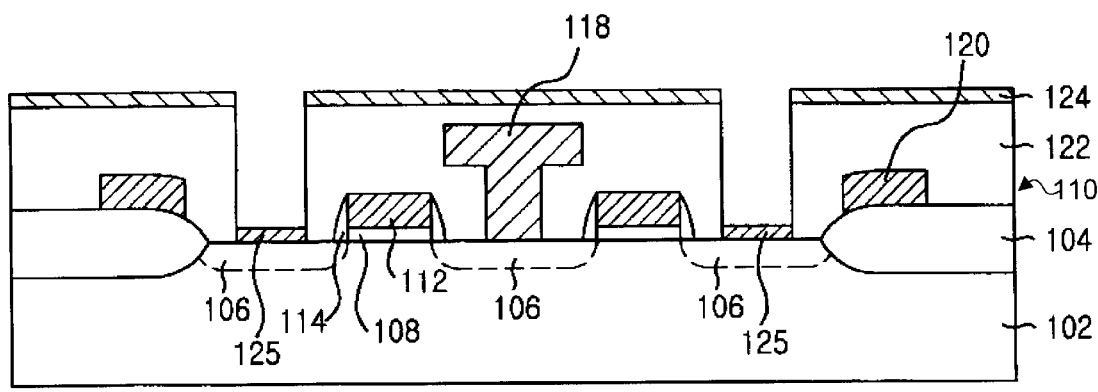
FIGS. 1A, 1B, 1C, 1D, 1E, 1F, 1G, 1H, 1I and 1J are schematic cross sectional views setting forth a method for the manufacture of the semiconductor memory device in accordance with the present invention.

The process for manufacturing the semiconductor device begins with the preparation of an active matrix 110 including a silicon substrate 102, an isolation region 104, diffusion regions 106, gate oxides 108, gate lines 112, a sidewall 114, a bit line 118, anti-reflection coating (ARC) films 124 and an insulating layer 122, as shown in FIG. 1A. The insulating layer 122 is made of a material, e.g., boron-phosphor-silicate glass (BPSG).

Thereafter, the insulating layer 122 is patterned into a predetermined configuration in such a way that the diffusion regions 106 are opened, thereby obtaining contact holes. Metal silicide films 125 are formed on the opened diffusion regions 106. The ARC films 124 are formed with a material having a high etch selectivity with respect to a dummy oxide layer to be formed thereon in a thickness ranging from approximately 300 Å to approximately 1,000 Å. In order to reduce contact resistance between the silicon substrate 102 and barrier metals, the metal silicide films 125, e.g., made of $TiSi_x$, can be formed therebetween in a thickness ranging from approximately 100 Å to approximately 300 Å.

Figure 1B:
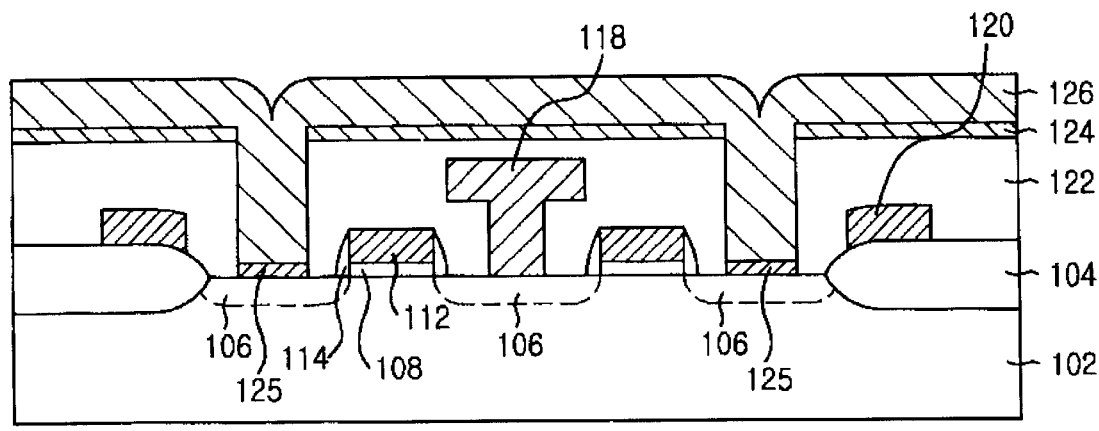

In a next step, a first metal layer 126 is formed on the metal silicide films 125 and the ARC films 124, as shown in FIG. 1B. In the preferred embodiment, the first metal layer is made of a material selected from a group consisting of TiN, TiSiN, TiAlN, TaSiN, TaAlN or the like.

Figure 1C:
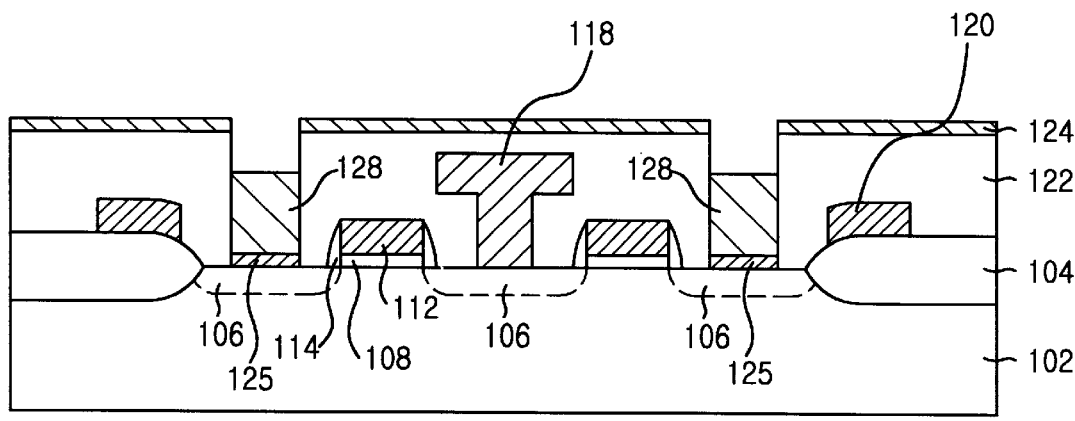

Thereafter, the first metal layer is etched back to a preset thickness by using a method such as a wet etch, thereby obtaining barrier metals 128, as shown in FIG. 1C. The bit line 118 is electrically connected to one of the diffusion regions 106 to apply an electric potential. Each of the barrier metals 128 is electrically connected to the other diffusion regions 106 via $TiSi_x$ films 125, respectively. Although the bit line 118 actually extends in right and left directions bypassing the barrier metals 128, the drawing does not show these parts of the bit line 118. The capacitor structures can be connected to a plate line (not shown) to apply thereto a common constant potential.

Figure 1D:
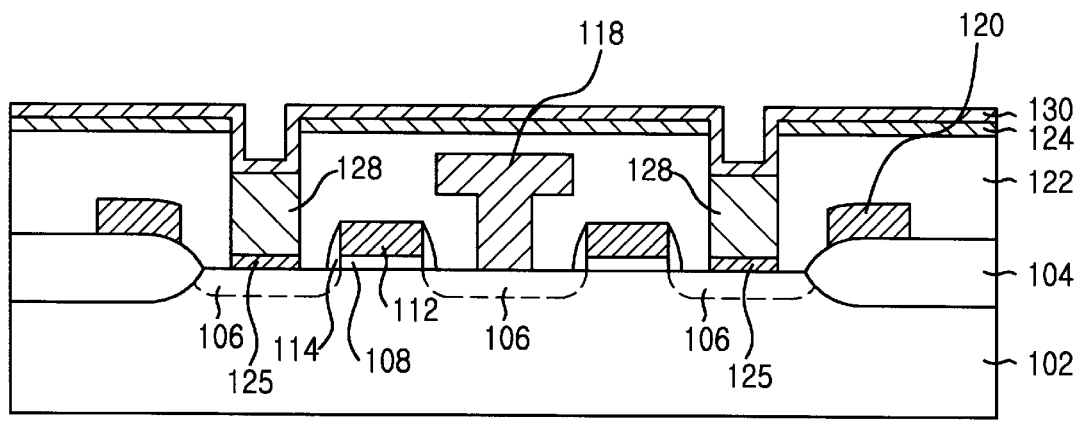

In an ensuing step, a seed layer 130 is formed by using a chemical vapor deposition (CVD) method on top of the ARC films 124 and the barrier metals 128, as shown in FIG. 1D. The seed layer 130 can be made of a material selected from a group consisting of Pt, Ru, Ir, Os, W, Mo, Co, Ni, Au, Ag or the like. It is preferable that if Pt is selected as the seed layer 130, the seed layer 130 has a thickness ranging from approximately 50 Å to approximately 1,000 Å. In the preferred embodiment, each of the barrier metals 128 is formed in such a way that the thickness thereof is less than that of the insulating layer 122. Therefore, portions of the seed layer 130, which formed on top of the barrier metals 128, are in the form of trench, whereby an electroplating material to be formed thereon is easily aligned with the portions of the seed layer 130.

Figure 1E:
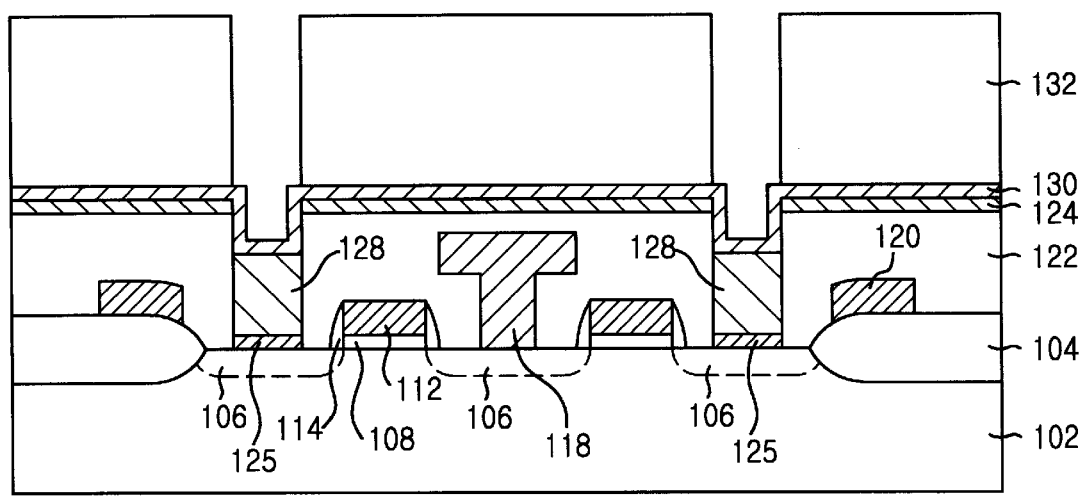

In a following step, a dummy oxide layer is formed on top of the seed layer 130 by using a method such as CVD. The dummy oxide layer can be made of PSG or USG. Preferably, the dummy oxide has a thickness ranging from approximately 5,000 Å to approximately 20,000 Å. Thereafter, the dummy oxide layer is patterned into a predetermined configuration in such a way that portions of the seed layer 130 located on top of the barrier metals 128 are exposed, thereby forming a patterned dummy oxide 132, as shown in FIG. 1E. The dummy oxide layer may be patterned using, for example, a dry etch back process.

Optionally, the active matrix 110 is dipped into a solution selected from a 90% $H_2SO_4$ solution, $H_2SO_4/H_2O_2$ solution, $HF/H_2O$ solution, $HF/HN_4F$ solution during 2–3600 seconds in order to remove particles or foreign material remaining on the exposed seed layer 130.

Figure 1F:
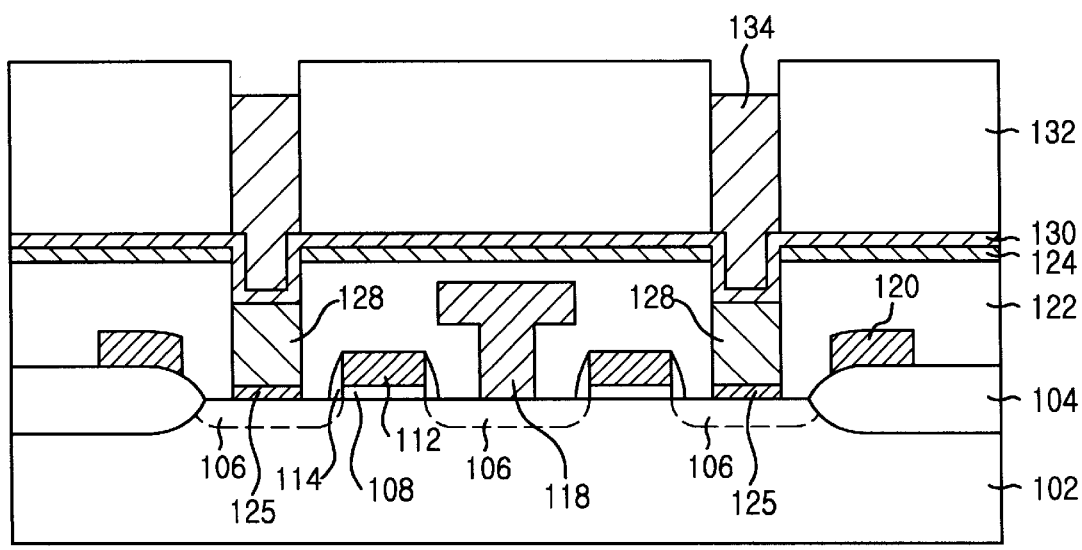

In a next step, the exposed portions of the seed layer 130 are electroplated with a material selected from a group consisting of consisting of Pt, Ru, Ir, Os, W, Mo, Co, Ni, Au, Ag or the like, as shown in FIG. 1F. It is preferable that an electroplating material 134 corresponds to that of the seed layer 130. If the electroplating material is Pt, a thickness of the electroplating material 134 has a thickness ranging from approximately 3,000 Å to approximately 10,000 Å. In this case, the electroplating process is carried out with a current density ranging from approximately 0.1 $mA/cm^2$ to approximately 10 $mA/cm^2$. 20. Alternatively, it is possible to deposit a conductive material on top of the exposed positions of the seed layer 130 by using a CVD.

Figure 1G:
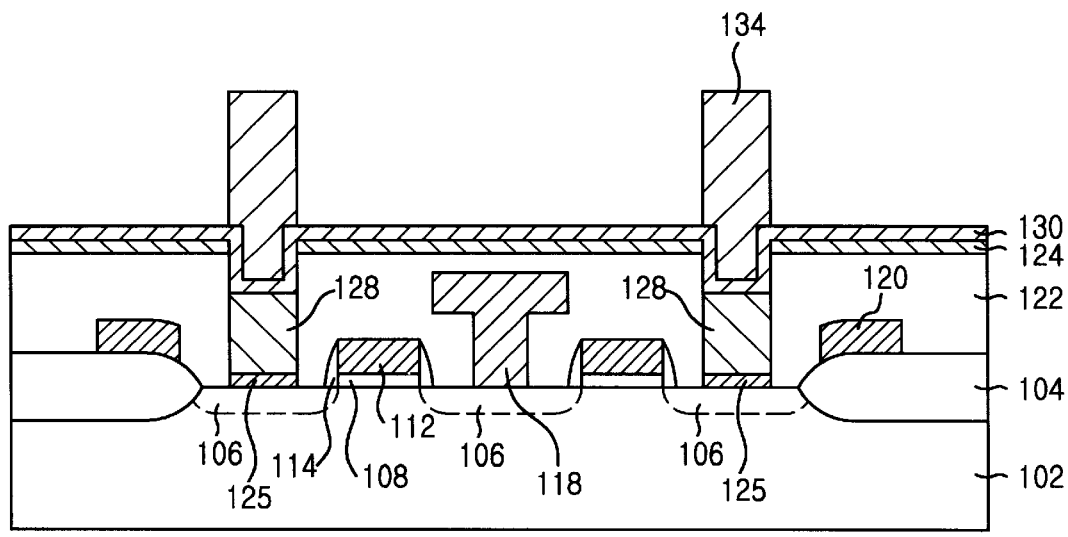

Thereafter, the patterned dummy oxide 132 is removed by using a method such as a wet etching, as shown in FIG. 1G.

Figure 1H:
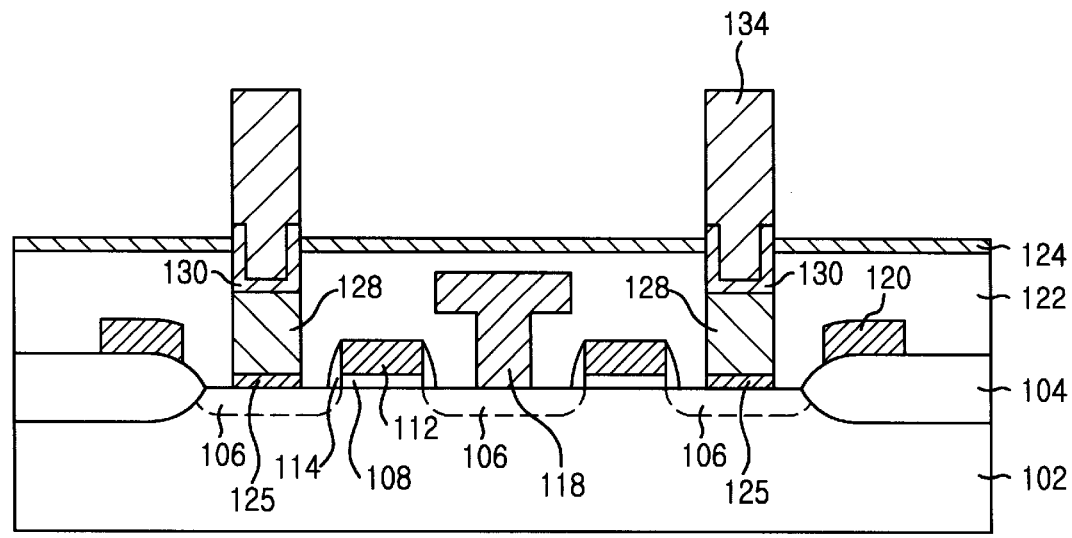

And then, the portions of the seed layer 130 which are not covered by the electroplating material 134 are etched-back by using a method such as a dry etching, thereby forming lower electrodes, wherein each of the lower electrodes includes a electroplating material 134 and an etched seed layer, as shown in FIG. 1H.

Figure 1I:
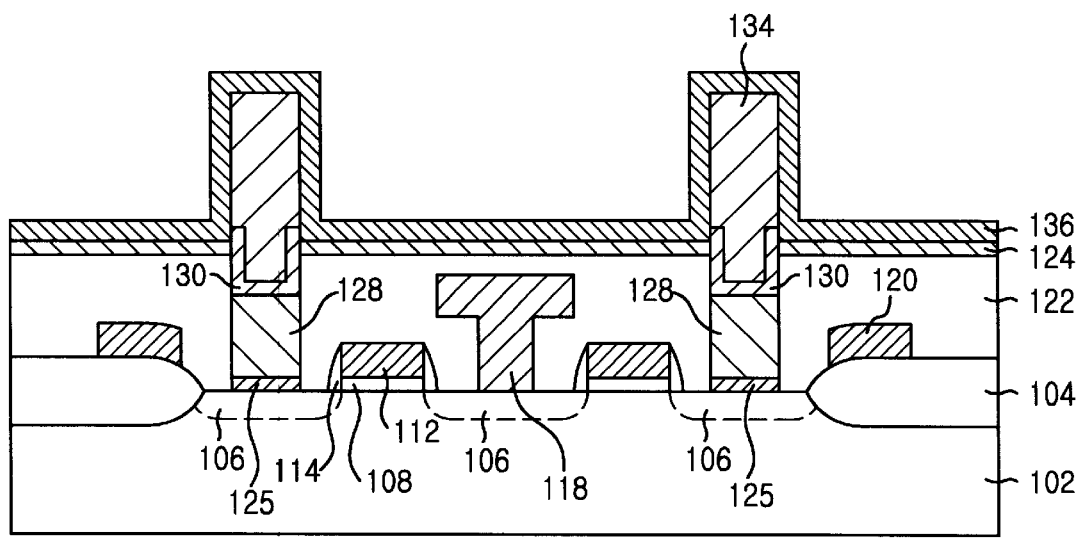

In a subsequent step, a capacitor dielectric layer 136, e.g., made of barium strontium titanate (BST), are formed on the electroplating material 134 and the ARC film 124 by using a CVD method at a temperature ranging from approximately 400° C. to approximately 600° C. in a thickness ranging from approximately 150 Å to approximately 500 Å, as shown in FIG. 1I. It is possible that the capacitor dielectric layer 136 are crystallized by using a rapid thermal process (RTP) at a temperature ranging from approximately 500° C. to approximately 700° C. in the presence of $N_2$ for 30–180 seconds.

Figure 1J:
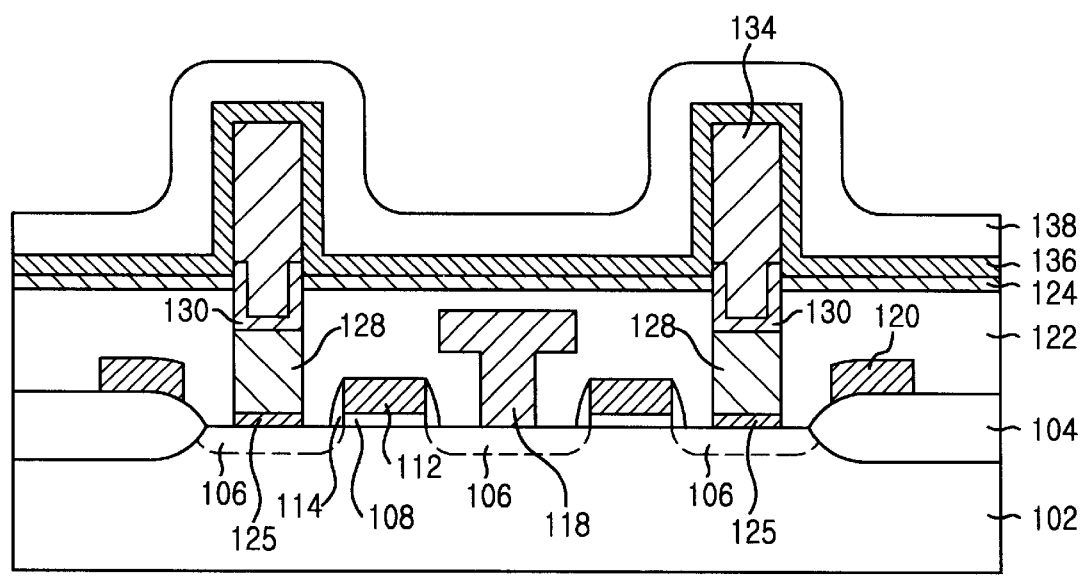

Finally, an upper electrode layer 138 is formed on the capacitor dielectric layer 136 by using a method such as a CVD, thereby forming capacitor structures, as shown in FIG. 1J.

While the present invention has been described with respect to the particular embodiments, it will be apparent to those skilled in the art that various changes and modifications may be made without departing from the scope of the invention as defined in the following claims.

What is claimed is:

1. A method for manufacturing a semiconductor device, comprising the steps of:

preparing an active matrix having at least one diffusion region and an insulating layer;

patterning the insulating layer into a predetermined configuration to expose the diffusion region;

forming a metal silicide film on the exposed diffusion region;

forming a barrier metal on the metal silicide film;

forming a seed layer over the active matrix including the barrier metal;

forming a dummy oxide layer over the seed layer;

patterning the dummy oxide layer into a preset configuration to expose portions of the seed layer covering the barrier metal;

filling the exposed portions of the seed layer with a conductive material to a predetermined thickness; and removing the dummy oxide layer and the unexposed portions of the seed layer.

2. The method of claim 1, further comprising the steps of:

forming a capacitor dielectric layer on the conductive material after removing the dummy oxide layer; and forming an upper electrode on the capacitor dielectric layer.

3. The method of claim 2, wherein the capacitor dielectric layer includes barium strontium titanate (BST).

4. The method of claim 1, further comprising the step of forming an anti-reflection coating (ARC) layer on the active matrix before patterning the insulation layer.

5. The method of claim 4, wherein the barrier metal includes a material selected from a group of TiN, TiSiN, TiAlN, TaSiN and TaAlN.

6. The method of claim 1, wherein the metal silicide film includes $TiSi_x$ and has a thickness ranging from approximately 100 Å to approximately 300 Å to reduce contact resistance.

7. The method of claim 1, wherein the step of forming a barrier metal includes forming it with its exposed surface below that of the insulating layer.

8. The method of claim 1, wherein the seed layer includes a material selected from a group of Pt, Ru, Ir, Os, W, Mo, Co, Ni, Au and Ag.

9. The method of claim 1, wherein the step of filling the exposed portions of the seed layer includes electroplating the exposed portions with a conductive material corresponding to that of the seed layer.

10. The method of claim 9, wherein the seed layer includes Pt and has a thickness ranging from approximately 50 Å to approximately 1,000 Å.

11. The method of claim 9, wherein said electroplating is carried out with a current density ranging from approximately 0.1 $mA/cm^2$ to approximately 10 $mA/cm^2$.

12. The method of claim 1, wherein the dummy oxide layer includes a phosphor silicate glass (PSG) and has a thickness ranging from approximately 5,000 Å to approximately 20,000 Å.

13. The method of claim 1, wherein the dummy oxide layer includes an undoped silicate glass (USG) and has a thickness ranging from approximately 5,000 Å to approximately 10,000 Å.

14. The method of claim 9, wherein said electroplating uses Pt having a thickness ranging from approximately 3,000 Å to approximately 10,000 Å.

15. The method of claim 1, wherein the step of patterning the dummy oxide includes using a dry etch back process.

16. The method of claim 2, wherein the step of forming a capacitor dielectric layer includes using chemical vapor deposition (CVD) at a temperature ranging from approximately 400° C. to approximately 600° C. in a thickness ranging from approximately 150 Å to approximately 500 Å.

17. The method of claim 2, further comprising crystallizing the capacitor dielectric layer by using a rapid thermal process (RTP) at a temperature ranging from approximately 500° C. to approximately 700° C. in the presence of $N_2$ for 30–180 seconds.

* * * * *